United States Patent
Kim et al.

(10) Patent No.: US 7,157,366 B2
(45) Date of Patent: Jan. 2, 2007

(54) METHOD OF FORMING METAL INTERCONNECTION LAYER OF SEMICONDUCTOR DEVICE

(75) Inventors: Il-Goo Kim, Seongnam-si (KR); Sang-Rok Hah, Seoul (KR); Sae-il Son, Gyeonggi-do (KR); Kyoung-Woo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 159 days.

(21) Appl. No.: 10/888,577

(22) Filed: Jul. 9, 2004

(65) Prior Publication Data

US 2005/0037605 A1 Feb. 17, 2005

Related U.S. Application Data

(63) Continuation-in-part of application No. 10/392,710, filed on Mar. 20, 2003, now Pat. No. 6,815,331, which is a continuation-in-part of application No. 10/114,274, filed on Apr. 2, 2002, now Pat. No. 6,861,347.

(30) Foreign Application Priority Data

Jul. 10, 2003 (KR) ............. 10-2003-0047006

(51) Int. Cl.
*H01L 21/4763* (2006.01)
(52) U.S. Cl. ............. 438/622; 438/618; 438/624; 438/634; 438/637; 438/638
(58) Field of Classification Search ............. 438/618, 438/622, 624, 634, 637, 638
See application file for complete search history.

(56) References Cited

U.S. PATENT DOCUMENTS 6,025,259 A 2/2000 Yu et al. ............. 438/618
6,037,255 A 3/2000 Hussein et al. ............. 438/675

(Continued)

FOREIGN PATENT DOCUMENTS

KR 2002-0058289 7/2002
KR 2002-0088399 11/2002

OTHER PUBLICATIONS

Korean Patent Abstracts for Publication No. 2002-0058289.

*Primary Examiner*—Michael Trinh
*Assistant Examiner*—Bac H. Au
(74) *Attorney, Agent, or Firm*—F. Chau & Associates LLC

(57) ABSTRACT

Various methods are provided for forming metal interconnection layers of semiconductor devices. One exemplary method for forming a metal interconnection layer of a semiconductor device includes forming an interlayer dielectric layer on a substrate, forming a hard mask layer on the interlayer dielectric layer, wherein the hard mask layer serves as an anti-reflection layer, depositing and patterning a first photoresist layer to form a first photoresist pattern on the hard mask layer, forming a partial via hole in the interlayer dielectric layer by etching the hard mask layer and the interlayer dielectric layer using the first photoresist pattern as an etching mask, removing the first photoresist pattern, depositing a second photoresist layer to fill the partial via hole with photoresist material and patterning the second photoresist layer to form a second photoresist pattern that defines a trench interconnection area which overlaps at least portion of the partial via hole, etching the hard mask layer using the second photoresist pattern as an etching mask to form a hard mask pattern, completely removing the second photoresist pattern and the photoresist material in the partial via hole, etching the interlayer dielectric layer using the hard mask pattern as an etching mask to form the trench interconnection area and to extend the partial via hole to form a full via hole, and filling the full via hole and the trench interconnection area with a conductive material.

38 Claims, 10 Drawing Sheets

U.S. PATENT DOCUMENTS

| | | | |
|---|---|---|---|
| 6,319,820 B1 * | 11/2001 | Liu | 438/633 |
| 6,323,121 B1 * | 11/2001 | Liu et al. | 438/633 |
| 6,323,123 B1 | 11/2001 | Liu et al. | 438/638 |
| 6,368,979 B1 | 4/2002 | Wang et al. | 438/723 |
| 6,448,177 B1 | 9/2002 | Morrow et al. | 438/638 |
| 6,455,416 B1 * | 9/2002 | Subramanian et al. | 438/636 |
| 6,465,358 B1 | 10/2002 | Nashner et al. | 438/700 |
| 6,861,347 B1 * | 3/2005 | Lee et al. | 438/622 |
| 2002/0081834 A1 | 6/2002 | Daniels et al. | 438/624 |
| 2003/0001273 A1 | 1/2003 | Steiner et al. | 257/760 |

* cited by examiner

METHOD OF FORMING METAL INTERCONNECTION LAYER OF SEMICONDUCTOR DEVICE

CROSS-REFERENCE TO RELATED APPLICATIONS

This application is a Continuation-in-Part of U.S. patent application Ser. No. 10/392,710, filed on Mar. 20, 2003, now U.S. Pat. No. 6,815,331 which claims priority to Korean Patent Application No. 02-27442, filed on May 17, 2002, and which is Continuation-in-Part of U.S. patent application Ser. No. 10/114,274, filed on Apr. 2, 2002, now U.S. Pat. No. 6,861,347 which claims priority to Korean Patent Application No. 01-26966 filed on May 17, 2001, all of which are fully incorporated herein by reference.

In addition, this application claims priority to Korean Patent Application No. 03-47006, filed on Jul. 10, 2003, which is fully incorporated herein by reference.

TECHNICAL FIELD OF THE INVENTION

The present invention relates to methods for manufacturing semiconductor devices, and more particularly, to improved methods for forming metal interconnection layers of semiconductor devices using a dual damascene process.

BACKGROUND

Due to the continuing increase in integration density of semiconductor devices, it has been increasingly necessary to fabricate semiconductor devices having metal interconnection layers with a multi-layer structure and with smaller distances between the metal interconnection layers. In accordance with these trends, parasitic resistance (R) and capacitance (C) components, which exist between horizontally or vertically adjacent metal interconnection layers, have become primary factors that are considered in the design and manufacture of semiconductor devices due to the adverse effects that such components can have on operation of semiconductor devices.

Indeed, parasitic resistance and capacitance components in a metal interconnection framework may cause, e.g., signal delay, which can deteriorate the electrical performance of a semiconductor device. In addition, parasitic resistance and capacitance components can increase the total power consumption of a semiconductor chip and increase the amount of signal leakage from the semiconductor chip. Therefore, it is important to develop a multi-layer interconnection framework that can provide smaller parasitic resistance and capacitance in a highly integrated semiconductor device.

To form a multi-layer interconnection structure having smaller parasitic resistance and capacitance, an interconnection layer should be formed using a metal having a low specific resistance, such as copper (Cu), and/or using an insulation layer having a small dielectric constant. However, it has proven difficult to form a Cu interconnection layer using a typical photolithography-based patterning process. Therefore, dual damascene processes have generally been implemented for forming Cu interconnection layers.

FIGS. 1 through 3 are cross-sectional schematic views illustrating a conventional method for forming a metal interconnection layer of a semiconductor device. Referring to FIG. 1, a first stopper layer 104, a first interlayer dielectric layer 105, a second stopper layer 106, and a second interlayer dielectric layer 107 are sequentially formed on a semiconductor substrate 100 having a first conductive layer 102. A full via hole 112 is formed having a first width W1 by sequentially etching the second interlayer dielectric layer 107, the second stopper layer 106, and the first interlayer dielectric layer 105 using a photolithography process.

Thereafter, a photoresist layer is deposited on the entire surface of the substrate, filling the full via hole 112 with photoresist material. Then, a photoresist pattern 110 is formed by light-exposing and developing the photoresist layer, to thereby provide an opening having a second width W2 which exposes part of the second interlayer dielectric layer 107 and part of the full via hole 112. Here, the second width W2 is larger than the first width W1. As depicted in FIG. 1, a portion of the photoresist layer remains in the full via hole 112.

Referring now to FIG. 2, the second interlayer dielectric layer 107 is dry-etched using the photoresist pattern 110 as an etching mask until the top surface of the second stopper layer 106 is exposed. As a result of the dry etching, a trench interconnection area 114 of width W2 is formed in the second interlayer dielectric layer 107. In addition, the dry etch process results in further etching of the photoresist layer in the full via hole 112.

Referring now to FIG. 3, the photoresist layer remaining in the full via hole 112 and the photoresist pattern remaining on the second interlayer dielectric layer 107 are removed using a conventional ashing process. Thereafter, the portion of the first stopper layer 104 that is exposed at the bottom of the full via hole 112 is removed, and a second conductive layer (not shown) is formed in the full via hole 112 and the trench interconnection area 114, thereby forming a dual damascene structure.

There are various disadvantages associated with the conventional method depicted in FIGS. 1–3. For example, because of variations in the thickness of the photoresist layer from region to region of the substrate, which is due to filling the full via holes 112 and different density of the via holes 112 in between the regions, it is very difficult to control the critical dimensions (CD) and the profile of the first photoresist pattern 110 using a photolithography process. In addition, the photoresist material in the full via hole 112 may not be successfully developed, which can prevent the second interlayer dielectric layer 107 from being fully etched away, resulting in formation of the fence 116 along the via hole 112 in the trench interconnection area 114. The fence 116 can result in a poor electrical connection between the first conductive layer 102 and the second conductive layer that fills the via hole and trench interconnection area.

FIGS. 4, 5 and 6 are cross-sectional schematic views illustrating another conventional method for forming a metal interconnection layer of a semiconductor device. Referring initially to FIG. 4, a first stopper layer 104, a first interlayer dielectric layer 105, and a second interlayer dielectric layer 107 are sequentially formed on a semiconductor substrate 100 having a first conductive layer 102. Thereafter, a full via hole 112 is formed having a first width W1 by sequentially etching the second interlayer dielectric layer 107 and the first interlayer dielectric layer 105 using a photolithography process. Then, a sacrificial layer 116, which comprises an organic or inorganic material, is deposited to fill a least a portion of the full via hole 112 A photoresist layer is then deposited on the entire surface of the substrate, filling the remaining portion of the full via hole 112. Then, a photoresist pattern 110 is formed by light-exposing and developing the photoresist layer, to thereby provide an opening having a second width W2 which exposes part of the second interlayer dielectric layer 107 and part of the full via hole 112. Here, the second width W2 is larger than the first width W1. As depicted in FIG. 4, a portion of the photoresist layer remains in the full via hole 112.

Referring now to FIG. 5, the second interlayer dielectric layer 107 is partially etched using the photoresist pattern 110 as an etching mask. As a result of the etching, a trench interconnection area 114 having the second width W2 is formed in the second interlayer dielectric layer 107. In addition, the dry etch process results in further etching of the photoresist layer in the full via hole 112 according to its etching selectivity with respect to the second interlayer dielectric layer 107. After the dry etch process, the photoresist layer 110 and the sacrificial layer 116 still remain in the full via hole 112.

Referring now to FIG. 6, the photoresist pattern 110 is removed, and then the sacrificial layer 116 remaining in the full via hole 112 is removed. Thereafter, the portion of the first stopper layer 104 exposed at the bottom of the full via hole 112 is removed, and then a second conductive layer (not shown) is formed in the trench interconnection area 114, thereby forming a dual damascene structure.

There are various disadvantages associated with the conventional method illustrated by FIGS. 4–6. Although the method can, to some extent, resolve the problem of varying thickness of the photoresist layer from region to region due to variation in the density of via holes 112, such method may still result in generation of the fence 116 along the via hole 112 (see FIG. 6) when the sacrificial layer 116 is formed of a bottom anti-reflection coating (BARC) material or is formed of the same organic material used to form the photoresist layer 116. Furthermore, when the sacrificial layer 116 is formed of an inorganic material, such as hydrogen silsesquioxane (HSQ), there is a need to further perform a stripping process to remove the sacrificial layer 116, which is a very complicated and difficult process.

SUMMARY OF THE INVENTION

Exemplary embodiments of the invention generally include improved methods for forming a metal interconnection layer of a semiconductor device, which are capable of eliminating problems and disadvantages associated with conventional methods such as described above.

In one exemplary embodiment of the invention, a method of forming a metal interconnection layer of a semiconductor device includes: forming an interlayer dielectric layer on a substrate; forming a hard mask layer on the interlayer dielectric layer, wherein the hard mask layer serves as an anti-reflection layer; depositing and patterning a first photoresist layer to form a first photoresist pattern on the hard mask layer; forming a partial via hole in the interlayer dielectric layer by etching the hard mask layer and the interlayer dielectric layer using the first photoresist pattern as an etching mask; removing the first photoresist pattern; depositing a second photoresist layer to fill the partial via hole with photoresist material and patterning the second photoresist layer to form a second photoresist pattern that defines a trench interconnection area which overlaps at least portion of the partial via hole; etching the hard mask layer using the second photoresist pattern as an etching mask to form a hard mask pattern; completely removing the second photoresist pattern and the photoresist material in the partial via hole; etching the interlayer dielectric layer using the hard mask pattern as an etching mask to form the trench interconnection area and to extend the partial via hole to form a full via hole; and filling the full via hole and the trench interconnection area with a conductive material.

In another exemplary embodiment of the invention, a method of forming a metal interconnection layer of a semiconductor device comprises forming an interlayer dielectric layer on a substrate; forming a hard mask layer on the interlayer dielectric layer, wherein the hard mask layer serves as an anti-reflection layer; depositing and patterning a first photoresist layer to form a first photoresist pattern on the hard mask layer; forming a partial via hole in the interlayer dielectric layer by etching the hard mask layer and the interlayer dielectric layer using the first photoresist pattern as an etching mask; removing the first photo resist pattern; depositing a layer of sacrificial material to completely or partially bury the partial via hole; depositing and patterning a second photoresist layer to form a second photoresist pattern that defines a trench interconnection area which overlaps at least a portion of the partial via hole; etching the hard mask layer using the second photoresist pattern as an etching mask to form a hard mask pattern; completely removing the second photoresist pattern and the layer of sacrificial material; etching the interlayer dielectric layer using the hard mask pattern as an etching mask to form the trench interconnection area and to extend the partial via hole to form a full via hole; and filling the full via hole and the trench interconnection area with a conductive material.

There are various advantages associated with methods according to the invention for forming a metal interconnection layer of a semiconductor device. For example, by initially forming a partial via hole (as opposed to a full via hole in the conventional methods described above) and filling the partial via hole with a photoresist layer, or a sacrificial layer before depositing the photoresist, it possible to prevent variations in the thickness of the photoresist layer in different regions of the semiconductor substrate, which can adversely affect the formation of a photoresist pattern. Moreover, methods according to the invention can prevent formation of a "fence" in the trench interconnection area near a via hole, as which occurs with conventional methods. Further, by removing second photoresist pattern and using a hard mask pattern to etch the interlayer dielectric layer to form the full via hole, damage to the interlayer dielectric layer caused by removal of the photoresist using an ashing process after the formation of the via hole (as done conventionally) can be eliminated. Moreover, methods of the invention can eliminate problems associated with an unopened via hole due to photoresist material remaining in a partial via hole in the process of forming a photoresist pattern. In addition, methods of the invention for forming a metal interconnection layer of a semiconductor device are also capable of preventing profile defects of the via hole even when the photoresist pattern is misaligned.

These and other exemplary embodiments, aspects, objects, features and advantages of the present invention will be described or become apparent from the following detailed description of exemplary embodiments thereof, which is to be read in connection with the accompanying drawings.

DETAILED DESCRIPTION OF EXEMPLARY EMBODIMENTS

Figure 1:
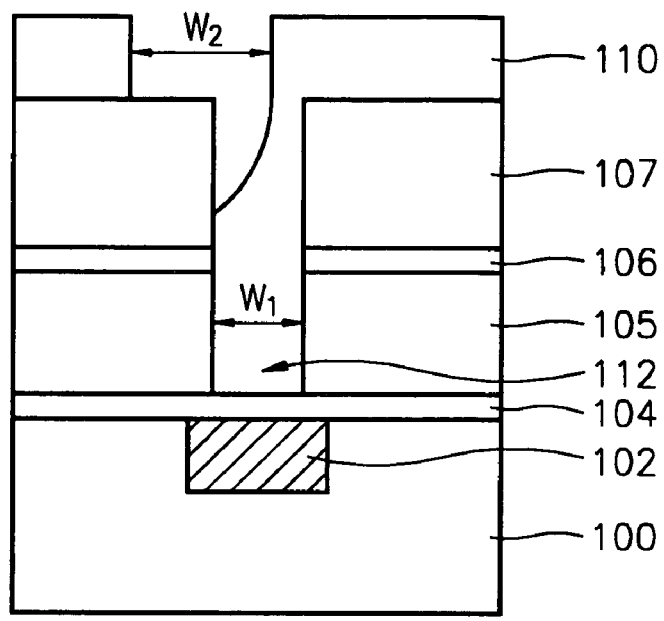
FIGS. 1, 2 and 3 are cross-sectional schematic views illustrating a conventional method for forming a metal interconnection layer of a semiconductor device.
Figure 2:
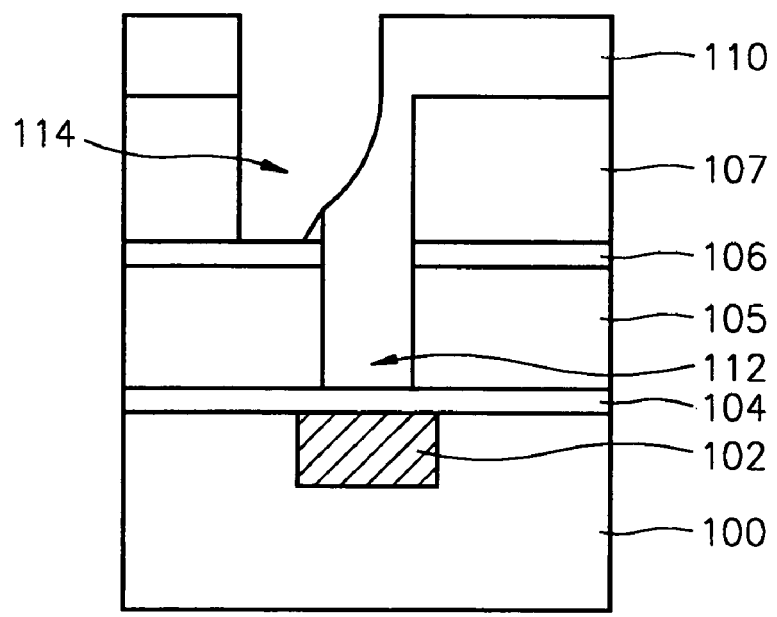
Figure 3:
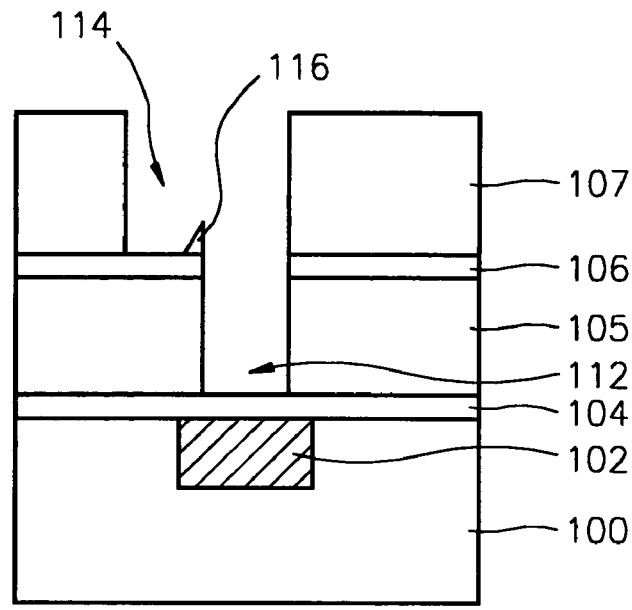
Figure 4:
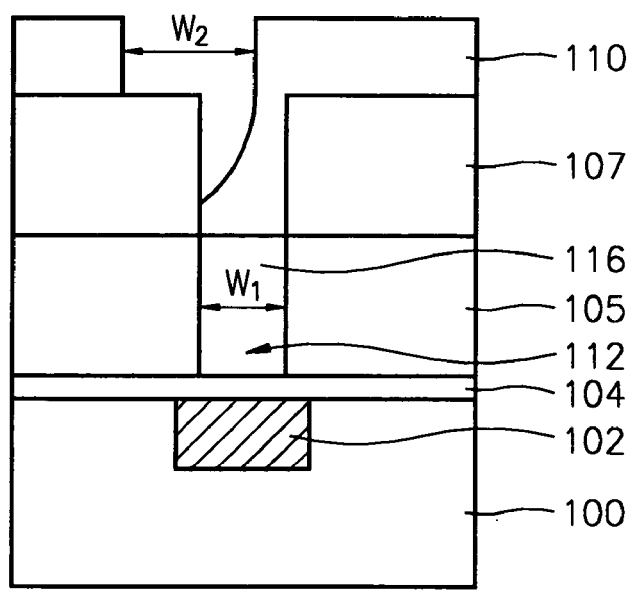
FIGS. 4, 5 and 6 are cross-sectional schematic views illustrating another conventional method for forming a metal interconnection layer of a semiconductor device.
Figure 5:
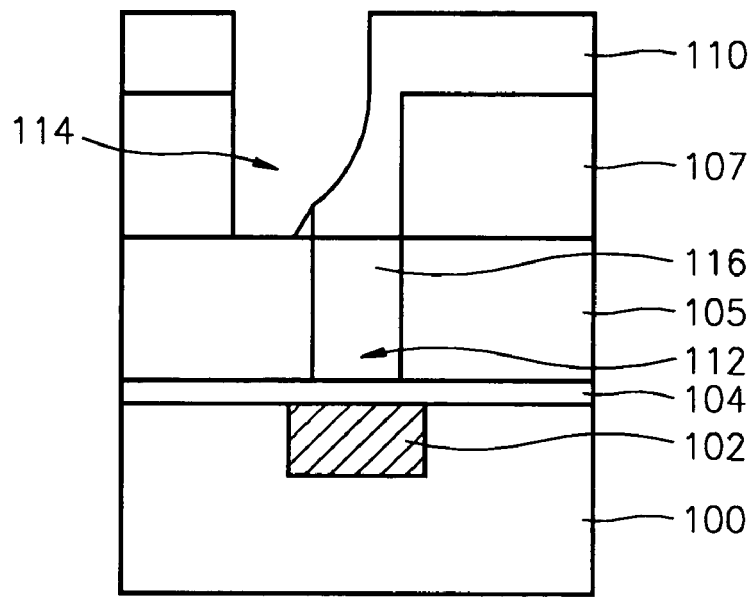
Figure 6:
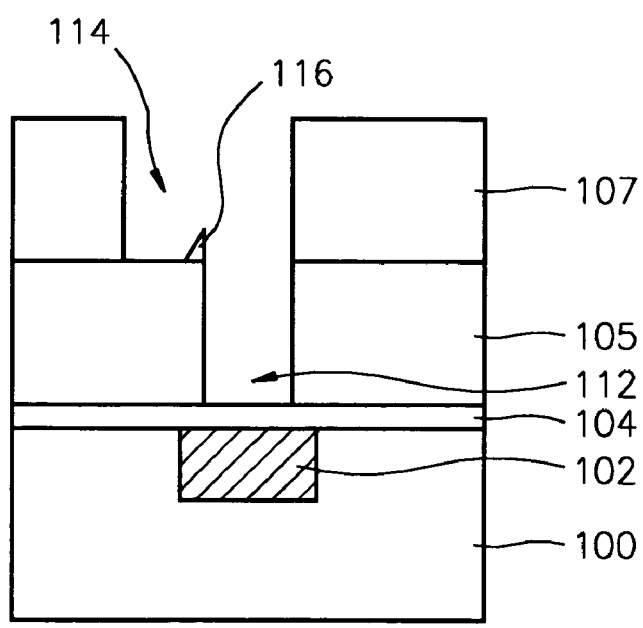

Hereinafter, exemplary embodiments of the present invention will be described more fully with reference to the accompanying drawings. These exemplary embodiments are provided so that this disclosure will be thorough and complete, and will fully convey concepts of the invention to one of ordinary skill in the art. However, one of ordinary skill in the art could readily envision other embodiments of the invention and nothing herein should be construed as limiting the scope of the invention. Further, it is to be understood that the drawings are schematic representations where the thickness of layers and regions are exaggerated for clarity. Moreover, the same reference numerals throughout the drawings may represent the same or similar elements, and thus their description may be omitted.

Figure 7:
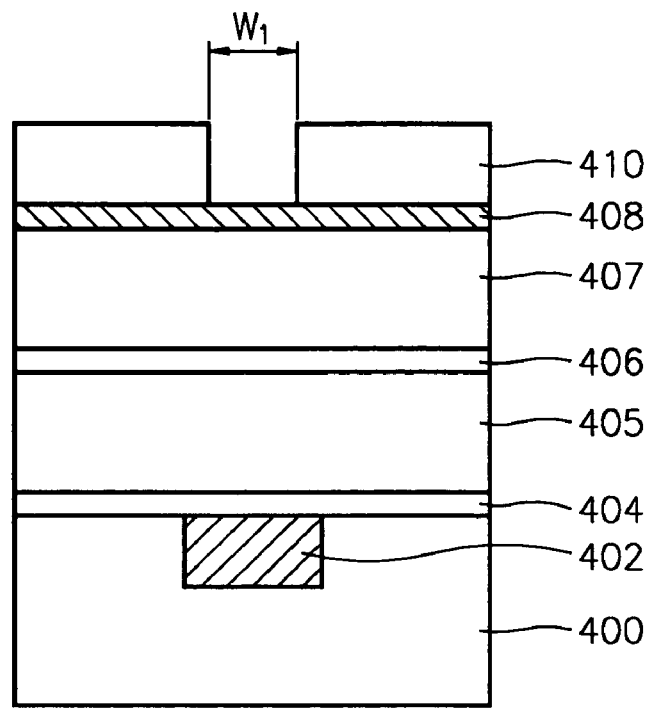
FIGS. 7 through 14 are cross-sectional schematic views illustrating a method for forming a metal interconnection layer of a semiconductor device according to an exemplary embodiment of the present invention.

FIGS. 7 through 14 are cross-sectional schematic views illustrating a method for forming a metal interconnection layer of a semiconductor device according to an exemplary embodiment of the present invention. Referring initially to FIG. 7, a first stopper layer 404 is formed on a semiconductor substrate 400 having a first conductive layer 402. A first interlayer dielectric layer 405 is then formed on the first stopper layer 404. In various exemplary embodiments of the invention, the first conductive layer 402 may be an impurity-doped region formed on the semiconductor substrate 400 or another metal interconnection layer, such as a copper interconnection layer or a tungsten interconnection layer. The first stopper layer 404 may be formed of a material having a high etching selectivity with respect to the first interlayer dielectric layer 405 formed thereon. For example, the first stopper layer 404 may be formed of a carbide-based dielectric material or a nitride-based dielectric material, more specifically, SiC, SiCN, BN, or SiN.

Moreover, the first interlayer dielectric layer 405 may be formed of either an organic oxide-based material or an inorganic oxide-based material. For example, the first interlayer dielectric layer 405 may be formed of a low dielectric material layer, such as an SiOC layer, a porous SiO$_2$ layer, a phosphorous silicate glass (PSG) layer, a boron phosphorous silicate glass (BPSG) layer, an undoped silicate glass (USG) layer, a fluorine doped silicate glass (FSG) layer, a high density plasma (HDP) layer, a plasma enhanced-tetra ethyl ortho silicate (PE-TEOS) layer, or a spin on glass (SOG) layer. The first interlayer dielectric layer 405 can be formed of a material having a high etching selectivity with respect to the first stopper layer 404.

As further depicted in FIG. 7, a second stopper layer 406 is formed on the first interlayer dielectric layer 405 and a second interlayer dielectric layer 407 is formed on the second stopper layer 406. In one exemplary embodiment, the second stopper layer 406 is formed of a material having a high etching selectivity with respect to the second interlayer dielectric layer 407 formed thereon, for example, a carbide-based dielectric material or a nitride-based dielectric material. More specifically, the second stopper layer 406 may be formed of SiC, SiCN, BN, or SiN. Further, the second interlayer dielectric layer 407, like the first interlayer dielectric layer 405, may be formed of an inorganic oxide-based material or an organic oxide-based material. For example, the second interlayer dielectric layer 407 can be formed of a low dielectric material layer, such as a SiOC layer, a porous SiO$_2$ layer, a PSG layer, a BPSG layer, a USG layer, a FSG layer, an HDP layer, a PE-TEOS layer, or an SOG layer. The second interlayer dielectric layer 407 can be formed of a material having a high etching selectivity with respect to the second stopper layer 406. The second interlayer dielectric layer 407 may be formed of a different material than the first interlayer dielectric layer 406 or more preferably, the second interlayer dielectric layer 407 is formed of the same material as that of the first interlayer dielectric layer 405.

As further depicted in FIG. 7, a hard mask layer 408 is formed on the second interlayer dielectric layer 407. In one embodiment, the hard mask layer 408 is formed of a material which has a high etching selectivity with respect to the second interlayer dielectric layer 407 and which enables the hard mask layer 408 to serve as an anti-reflection layer (ARL) in a subsequent photolithography process. For example, to form an ARL that provides robust anti-reflection functions, the hard mask layer 408 may be formed of (i) a carbon nitride-based dielectric material such as an SiCN-based dielectric material, (ii) an oxynitride-based dielectric material such as an SiON-based dielectric material, (iii) a carbon oxynitride-based dielectric material such as an SiCON-based dielectric material, or (iv) a metal material such as TaN, TiN, TiON, or TaON. Alternatively, the hard mask layer 408 may be formed of AlN or AlON, which provides relatively weak anti-reflection functions.

In various exemplary embodiments of the invention, the hard mask layer 408 may be formed of a single layer that can serve as an ARL as well as a hard mask layer, or formed of a stack of anti-reflection layers, or formed of a first layer that serves as an ARL and a second layer that does not serve as an ARL. Further, the hard mask layer 408 may be formed of a metal oxide such as AlO, TaO, or TiO, in which case the hard mask layer 408 does not serve as an ARL but provides a superior etching selectivity to the first and second interlayer dielectric layers 405 and 407.

In one exemplary embodiment where the hard mask layer 408 is formed of a single ARL, such layer may have a thickness of about 1000 Å. In another embodiment where the hard mask layer 408 is formed of a stacked layer comprising two ARLs, such layer may have a thickness of about 1000 Å. In yet another embodiment where the hard mask layer 408 is formed of a stacked layer comprising a non-ARL (lower layer) formed on the interlayer dielectric layer 407 and an ARL (upper layer) formed on the non-ARL, the upper layer may have a thickness of about 600 Å and the lower layer may have a thickness in the range of about 100 Å to about 200 Å. The non-ARL (lower layer) does not serve as an ARL but has a high etching selectivity to the first and second interlayer dielectric layers 405 and 407.

Referring again to FIG. 7, a first photoresist pattern 410 is formed on the hard mask layer 408, wherein the photoresist pattern comprises an opening of a first width W1 that exposes a portion of a top surface of the hard mask layer 408. More specifically, the hard mask layer 408 is coated with photoresist, and the photoresist is light-exposed and developed, thus forming the first photoresist pattern 410.

Figure 8:
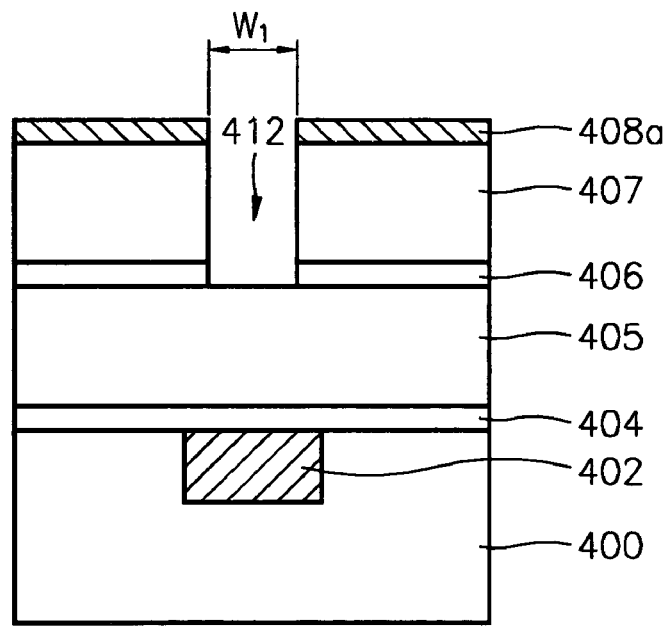

Referring now to FIG. 8, in one exemplary embodiment, the hard mask layer 408, the second interlayer dielectric layer 407, and the second stopper layer 406 are sequentially etched using the first photoresist pattern 410 as an etching mask, to thereby form a partial via hole 412 of width W1 in the second interlayer dielectric layer 407, followed by removal of the first photoresist pattern 410 using, e.g., an ashing process. In another exemplary embodiment of the invention, the etching process is performed by etching the hard mask layer 408 using the first photoresist pattern 410 as an etching mask to form a first hard mask pattern 408a, removing the first photoresist pattern 410 using a typical method such as ashing, and then etching the second interlayer dielectric layer 407 and the second stopper layer 406 using the first hard mask pattern 408a as an etching mask to form the partial via hole 412 of width W1 in the second interlayer dielectric layer 407.

Figure 9:
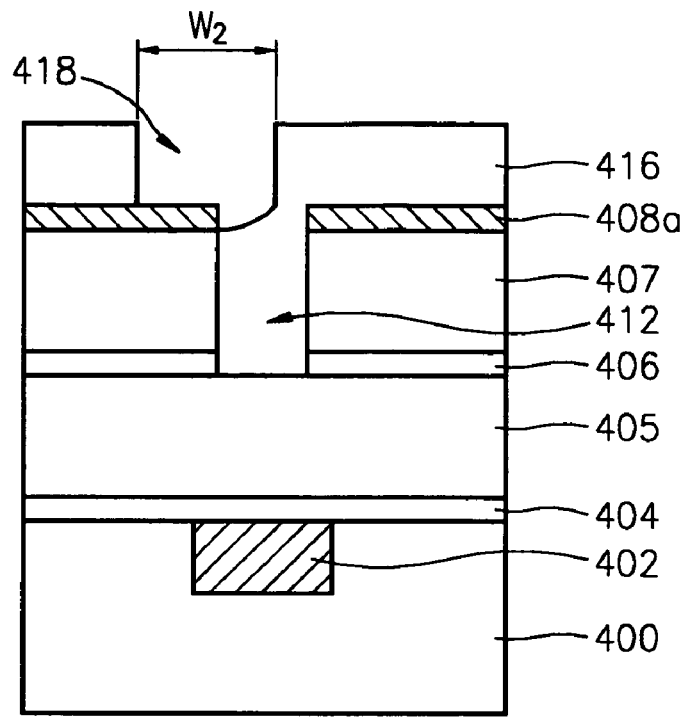

Referring now to FIG. 9, a second photoresist layer is deposited over the semiconductor device to fill the partial via hole 412 with the photoresist material. In one embodiment where the hard mask layer 408 serves as an ARL, no additional step is needed to form an ARL layer. In another embodiment of the invention where the hard mask layer 408 does not serve and an ARL, an ARL layer could be formed before deposition of the second photoresist layer. The second photoresist layer is exposed and developed to form a second photoresist pattern 416 having an opening of a second width W2 through which a portion of the hard mask pattern 408a is exposed. The second photoresist pattern 416 defines a trench interconnection area 418, which overlaps at least part of the partial via hole 412.

Figure 10:
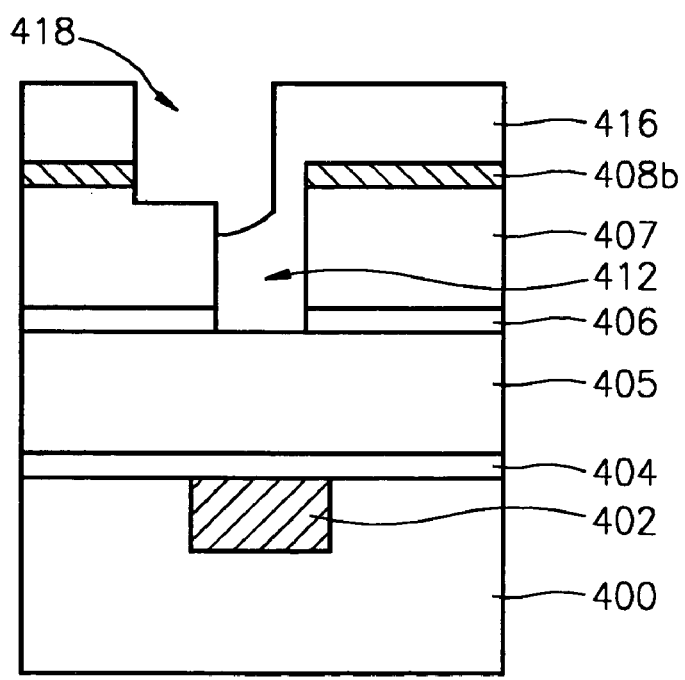

Referring now to FIG. 10, a second hard mask pattern 408b is formed by dry-etching the exposed first hard mask pattern 408a on the second interlayer dielectric layer 407 using the second photoresist pattern 416 as an etching mask. In the process of etching the first hard mask pattern 408a to form the second hard mask pattern 408b, the photoresist material in the partial via hole 412 may be etched to a depth below the bottom surface of the hard mask layer 408, such as depicted in FIG. 10. The hard mask layer 408 can be etched using an etching gas having a low etching ratio of the hard mask layer 408 to the photoresist layer 416, for example, lower than 2:1. A fluorine-based gas, such as $CF_4$, $CH_2F_2$, $CHF_3$, $CH_3F$, $NF_3$, or $SF_6$, can be used as t etching gas. Alternatively, an oxygen-based gas, such as $O_2$, CO, or $CO_2$, a nitrogen-based gas, such as $N_2$ or $N_2O$, or an inert gas, such as Ar, He, or Xe, can be used as the etching gas.

In another embodiment of the invention, the process of forming the second hard mask pattern 408b may be performed by first etching the photoresist pattern 416 to etch the photoresist material in the partial via hole 412 down below the bottom surface of the hard mask pattern 408a by using a mixture of two or more of an oxygen-based gas, a nitride-based gas, and a hydrogen-based gas, followed by etching the hard mask pattern 408a using the second photoresist pattern 416 as an etching mask.

In another exemplary embodiment where the hard mask layer 408 is formed of metal nitride, such as AlN, TaN, or TiN, metal oxide, such as AlO, TaO, or TiO, or a combination thereof, a chloride-based gas, such as $Cl_2$ or $BCl_3$, can be used for etching the hard mask layer 408.

Figure 11:
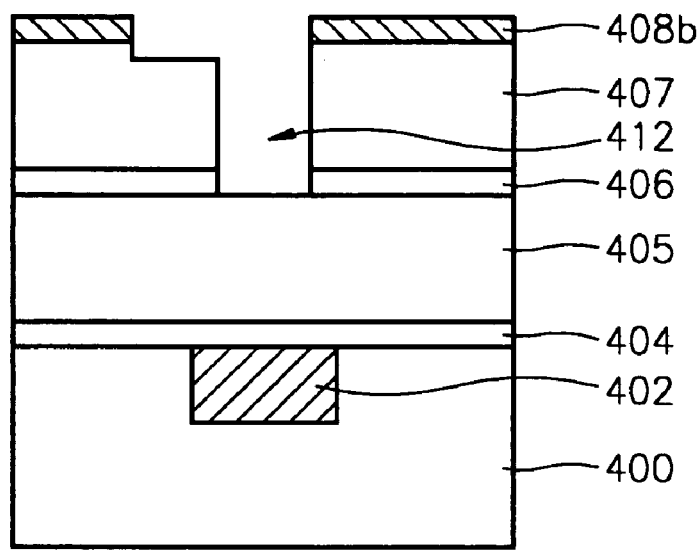
Figure 12:
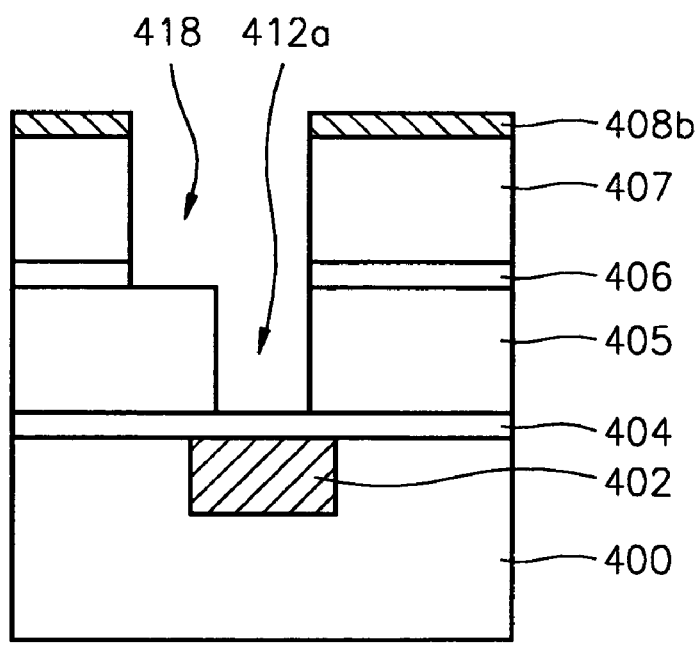

Referring now to FIGS. 11 and 12, the second photoresist pattern 416 is completely removed through a method such as ashing, using a mixed gas of oxygen, nitrogen, or hydrogen. Then, an etching process is performed using the second hard mask pattern 408b as an etching mask. As depicted in FIG. 12, during the etching process, the second interlayer dielectric layer 407 and the second stopper layer 406 in the trench interconnection area 418 are etched away, and the first interlayer dielectric layer 405 exposed by the partial via hole 412 is etched away, thus forming a full via hole 412a. For etching the first and second interlayer dielectric layers 405 and 407 using the second hard mask pattern 408b as an etching mask, a $C_xF_y$-based gas, such as $C_4F_8$, $C_4F_6$, or $C_5F_8$, a $CH_xF_y$-based gas, such as $CH_2F_2$ or $CH_3F$, an oxygen-based gas, such as $O_2$, CO, or $CO_2$, a nitrogen-based gas, such as $N_2$ or $N_2O$, or an inert gas, such as He, Ar, or Xe can be used as an etching gas.

Figure 13:
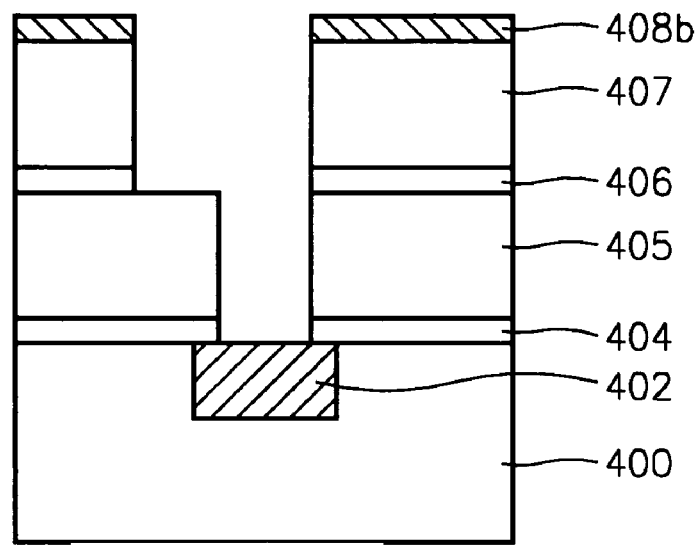

Referring now to FIG. 13, the portion of the first stopper layer 404 exposed through the full via hole 412a is etched away. In the process of removing the first stopper layer 404, a mixture of at least one of a fluorine-based gas, such as $CF_4$, $CH_2F_2$, or $CHF_3$, an oxygen-based gas, such as $O_2$, CO, or $CO_2$, a nitrogen-based gas, such as $N_2$ or $N_2O$, and a hydrogen-based gas can be used as an etching gas.

Figure 14:
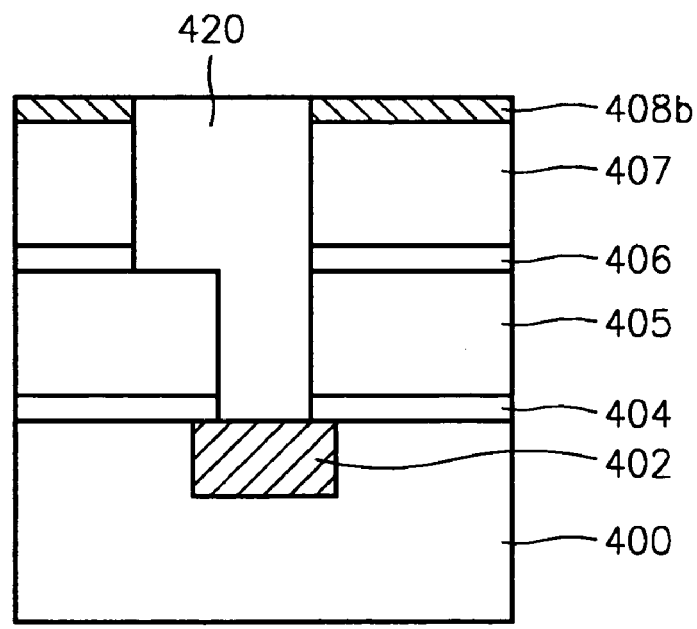

Referring to FIG. 14, a layer of conductive material comprising copper or tungsten is deposited to fill the trench interconnection area 418 and the full via hole 412a, and the layer of conductive material is then planarized to form a second conductive layer 420 which is in electrical contact with the first conductive layer 402. In the process of forming the second conductive layer 420, the second hard mask pattern 408b can be etched away or left behind, and then subsequent processes are carried out.

Figure 15:
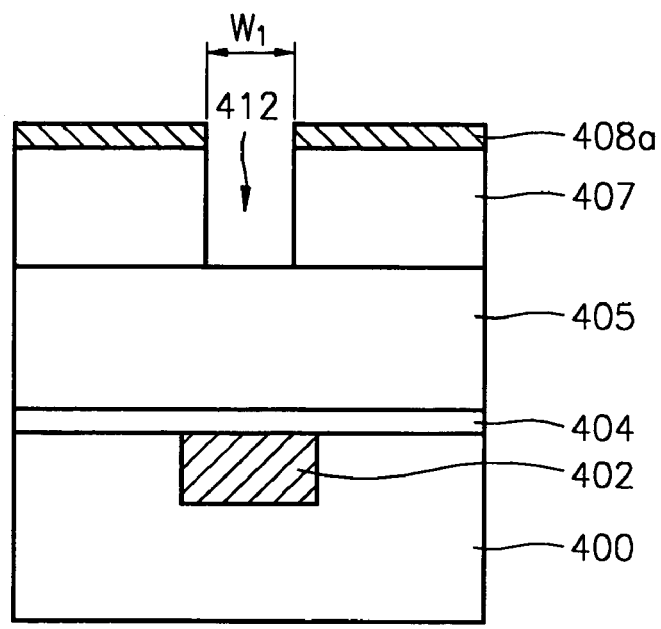
FIGS. 15 through 20 are cross-sectional schematic views illustrating a method for forming a metal interconnection layer of a semiconductor device according to another exemplary embodiment of the present invention.

FIGS. 15 through 20 are cross-sectional schematic views illustrating a method for forming a metal interconnection layer of a semiconductor device according to another exemplary embodiment of the present invention. Referring initially to FIG. 15, a first stopper layer 404 is formed on a semiconductor substrate 400 having a first conductive layer 402. A first interlayer dielectric layer 405 is then formed on the first stopper layer 404 and a second interlayer dielectric layer 407 is formed on the first interlayer dielectric layer 405.

In various exemplary embodiments of the invention, the first conductive layer 402 may be an impurity-doped region formed on the semiconductor substrate 400 or another metal interconnection layer, such as a copper interconnection layer or a tungsten interconnection layer. The first stopper layer 404 may be formed of a material having a high etching selectivity with respect to the first interlayer dielectric layer 405. For example, the first stopper layer 404 may be formed of a carbide-based dielectric material or a nitride-based dielectric material, more specifically, SiC, SiCN, BN, or SiN.

Moreover, the first interlayer dielectric layer 405 may be formed of either an organic oxide-based material or an inorganic oxide-based material. The second interlayer dielectric layer 407, like the first interlayer dielectric layer 405, may be formed of an inorganic oxide-based material or an organic oxide-based material. The second interlayer dielectric layer 407 may be formed of a different material than the first interlayer dielectric layer 406 or more preferably, the second interlayer dielectric layer 407 is formed of the same material as that of the first interlayer dielectric layer 405.

Next, as with the exemplary method described above with reference to FIG. 7, for example, a hard mask layer 408 is deposited on the second interlayer dielectric layer 407. In one exemplary embodiment, the hard mask layer 408 is formed of a material which has a high etching selectivity with respect to the second interlayer dielectric layer 407 and which enables the hard mask layer 408 to serve as an anti-reflection layer (ARL) in a subsequent photolithography process. For example, to form an ARL that provides robust anti-reflection functions, the hard mask layer 408 may be formed of (i) a carbon nitride-based dielectric material such as an SiCN-based dielectric material, (ii) an oxynitride-based dielectric material such as an SiON-based dielectric material, (iii) a carbon oxynitride-based dielectric material such as an SiCON-based dielectric material, or (iv) a metal material such as TaN, TiN, TiON, or TaON. Alternatively, the hard mask layer 408 may be formed of AlN or AlON, which provides relatively weak anti-reflection functions.

In various exemplary embodiments of the invention, the hard mask layer 408 may be formed of a single layer that can serve as an ARL as well as a hard mask, or a multiple layer of various ARL materials, or a double layer comprising a material layer that can serve as an ARL and another material layer that does not serve as an ARL. The hard mask layer 408 may be formed of, for example, metal oxide, such as AlO, TaO, or TiO, in which case the hard mask layer 408 does not serve as an ARL but provides a superior etching selectivity to the first and second interlayer dielectric layers 405 and 407.

In one exemplary embodiment where the hard mask layer 408 is formed of a single ARL layer, such layer may have a thickness of about 1000 Å. In another embodiment where the hard mask layer 408 is formed of a double layer comprising two ARLs, such layer may have a thickness of about 1000 Å. In another embodiment where the hard mask layer 408 is formed of a double layer comprising an ARL as an upper layer and a non-ARL as a lower layer, the upper and lower layers may have a thickness of about 600 Å and a thickness of about 100–200 Å, respectively.

Referring again to FIG. 15, a first photoresist pattern (not shown) having an opening of a first width W1 is formed on the hard mask layer 408 to expose a portion of the top surface of the hard mask layer 408. Thereafter, a partial via hole 412 having the first width W1 is formed in the second interlayer dielectric layer 407 by etching the hard mask layer 408 (to form first hard mask pattern 408a) and the second interlayer dielectric layer 407 using the first photoresist pattern 416 as an etching mask. Thereafter, the first photoresist pattern is removed.

Figure 16:
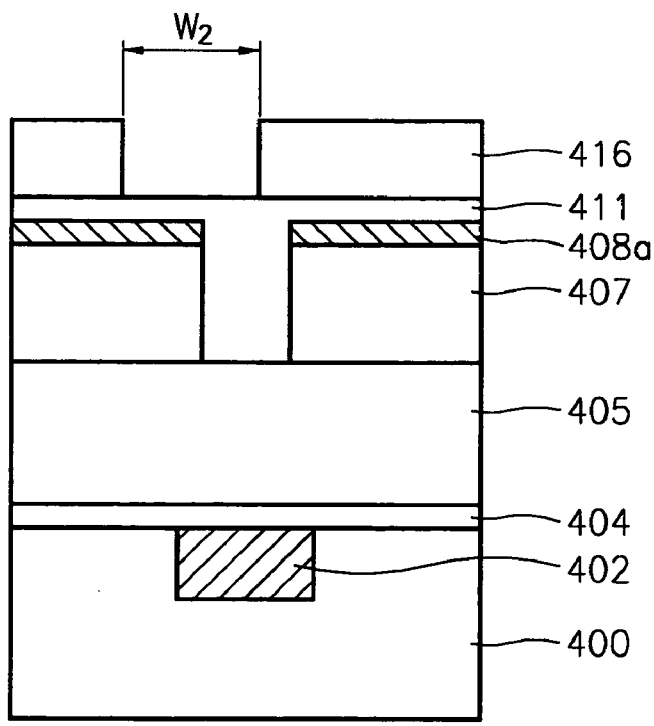

Referring to FIG. 16, in one exemplary embodiment of the invention, a sacrificial layer 411 is formed over the entire surface of the semiconductor device, filling the partial via hole 412 with sacrificial material and forming the sacrificial layer 411 on the first hard mask pattern 408a having a uniform thickness. In one exemplary embodiment, the sacrificial layer 411 is formed of a BARC material, which is a carbide-based organic material, through SOG or CVD process. The sacrificial layer 411 may be formed to partially or entirely fill the partial via hole 412. Thereafter, a photoresist layer is deposited on the sacrificial layer 411 and then patterned to form a second photoresist pattern 416 having an opening of a second width W2 to expose a portion of the first hard mask pattern 408a adjacent the partial via hole 412. The second width W2 is larger than the first width W1.

Figure 17:
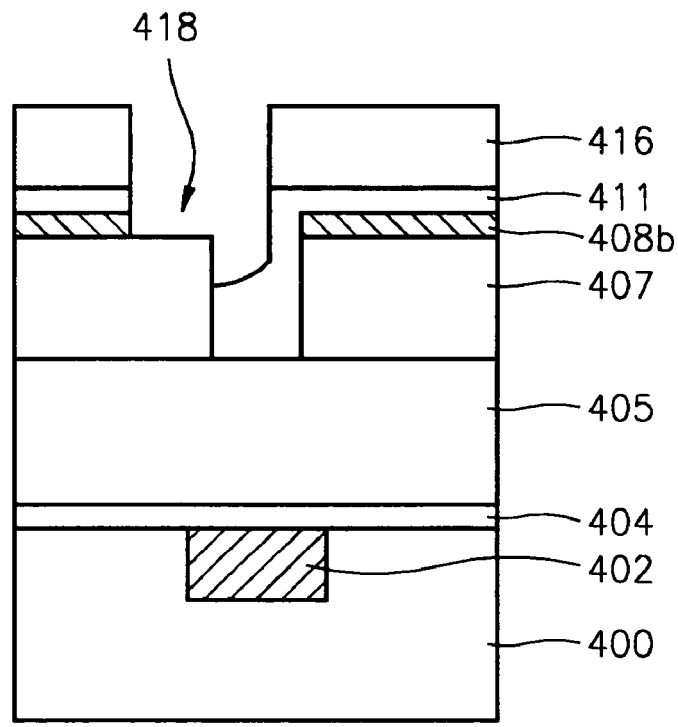

Referring now to FIG. 17, the sacrificial layer 411 and the first hard mask pattern 408a are dry-etched using the second photoresist pattern 416 as an etching mask, thus forming a second hard mask pattern 408b that defines a trench interconnection area 418 which overlaps at least part of the partial via hole 412. In this etch process, the sacrificial layer 411 in the partial via hole 412 may be etched to a depth below the bottom surface of the hard mask layer 408. The hard mask layer 408 can be etched using an etching gas having a low etching ratio of the hard mask layer 408 to the photoresist layer 416, for example, lower than 2:1. A fluorine-based gas, such as $CF_4$, $CH_2F_2$, $CHF_3$, $CH_3F$, $NF_3$, or $SF_6$, can be used as the etching gas. Alternatively, an oxygen-based gas, such as $O_2$, CO, or $CO_2$, a nitrogen-based gas, such as $N_2$ or $N_2O$, or an inert gas, such as Ar, He, or Xe, can be used as the etching gas.

In another embodiment of the invention, the process of forming the second hard mask pattern 408b using the second photoresist pattern 416 as an etching mask may include first etching the sacrificial layer 411 in the partial via hole 412 to a depth below the bottom surface of the hard mask layer 408, followed by etching the hard mask pattern 408a by using at least one of an oxygen-based gas, a nitride-based gas, and a hydrogen-based gas.

In another embodiment where the hard mask layer 408 is formed of metal nitride, such as AlN, TaN, or TiN, metal oxide, such as AlO, TaO, or TiO, or a combination thereof, a chloride-based gas, such as $Cl_2$ or $BCl_3$, can be used for etching the hard mask pattern 408a.

Figure 18:
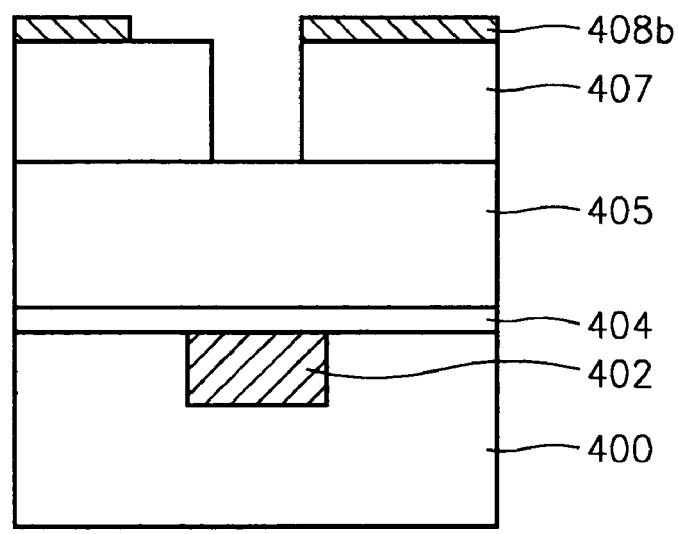
Figure 19:
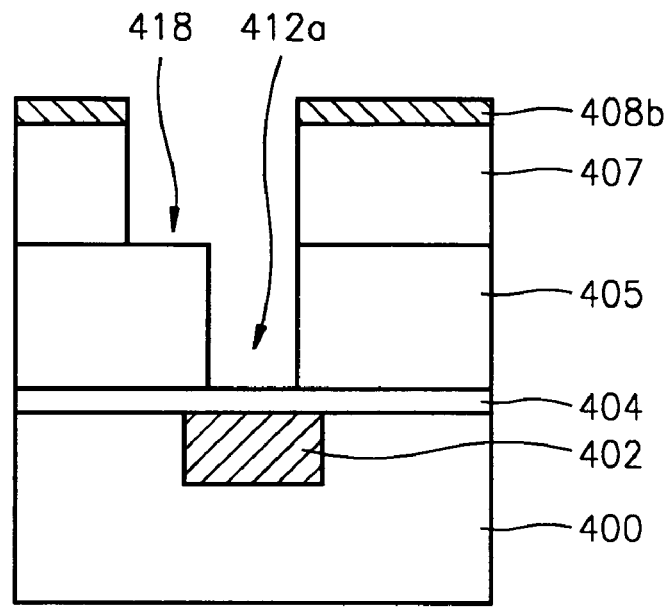

Referring now to FIGS. 18 and 19, the second photoresist pattern 416 and the sacrificial layer 411 are removed using, for example, an ashing process using a mixed gas of oxygen, nitrogen, or hydrogen. An etching process is then performed using the second hard mask pattern 408b as an etching mask. During the etching, the second interlayer dielectric layer 407 in the trench interconnection area 418 is etched away, and the first interlayer dielectric layer 405 exposed by the partial via hole 412 is etched away, thus forming a full via hole 412a. In the process of etching the first and second interlayer dielectric layers 405 and 407 using the second hard mask pattern 408b as an etching mask, a $C_xF_y$-based gas such as $C_4F_8$, $C_4F_6$, or $C_5F_8$, a $CH_xF_y$-based gas such as $CH_2F_2$ or $CH_3F$, an oxygen-based gas such as $O_2$, CO, or $CO_2$, a nitrogen-based gas such as $N_2$ or $N_2O$, or an inert gas, such as He, Ar, or Xe can be used as an etching gas.

Figure 20:
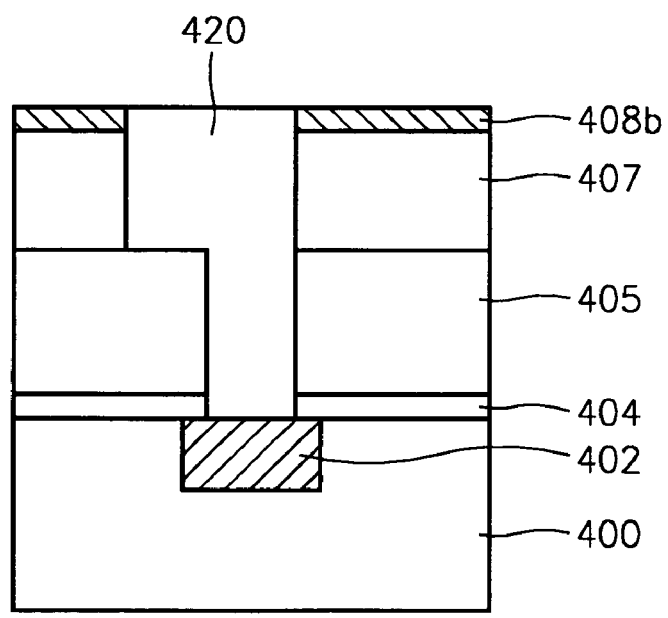

Referring now to FIG. 20, the portion of the first stopper layer 404 exposed through the full via hole 412a is etched away using, for example, an etching gas comprising a mixture of at least one of a fluorine-based gas such as $CF_4$, $CH_2F_2$, or $CHF_3$, an oxygen-based gas such as $O_2$, CO, or $CO_2$, a nitrogen-based gas such as $N_2$ or $N_2O$, or a hydrogen-based gas. Thereafter, a layer of conductive material comprising copper or tungsten is deposited to fill in the trench interconnection area 418 and the full via hole 412a, and then planarized to form a second conductive layer 420 that electrically contacts the first conductive layer 402. In the process of forming the second conductive layer 420, the second hard mask pattern 408b can be etched away or left behind, and then subsequent processes are performed.

There are various advantages associated with methods for forming metal interconnection layers according to the invention. For example, by initially forming a partial via hole (as opposed to a full via hole in the conventional methods described above) and filling the partial via hole with a photoresist layer, or a sacrificial layer before depositing the photoresist, it is possible to prevent variations in the thickness of the photoresist layer in different regions of the semiconductor substrate, which can adversely affect the formation of a photoresist pattern. Moreover, the present invention can be readily applied to next-generation photoresists, such as ArF photoresists, having no etching tolerance.

Moreover, methods according to the invention, which comprise initially forming a partial via hole, can prevent formation of a "fence" when forming the trench interconnection area, which can occurs with conventional methods as discussed above.

Another advantage associated with methods according to the present invention is that the use of a hard mask layer as an anti-reflection layer simplifies the entire process for forming a metal interconnection layer.

In addition, by completely removing the second phototresist pattern 416 and using the hard mask pattern 408b to etch the full via hole 412a (as opposed to using a photoresist pattern to etch the full via hole 412a) the present invention can prevent damage to the interlayer dielectric layer that can be caused by an ashing process to remove the photoresist pattern, even when a metal interconnection layer is formed of a low dielectric material.

A further advantage of the present invention is that the stopper layer (which covers the first conductive layer) is etched after the interconnection area and via hole are formed by etching the interlayer dielectric layers. Thus, the first conductive layer is minimally exposed to the environment, which prevents, e.g., formation of a metal oxide layer on the first conductive layer during removal of photoresist patterns.

Another advantage associated with the present invention is that since the partial via hole is buried with an organic or inorganic material before forming the second photoresist pattern, it is possible to prevent an unopened via hole caused by photoresist remaining at the bottom of the partial via hole when forming the second photoresist pattern. Furthermore, since the partial via hole is buried with an organic or inorganic material before forming the second photoresist pattern, it is possible to prevent the profile of the via hole from deteriorating even when the second photoresist pattern is misaligned with other elements of a semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for forming a metal interconnection layer of a semiconductor device, comprising:

forming an interlayer dielectric layer on a substrate;

forming a hard mask layer on the interlayer dielectric layer, wherein the hard mask layer serves as an anti-reflection layer;

depositing and patterning a first photoresist layer to form a first photoresist pattern on the hard mask layer;

forming a partial via hole in the interlayer dielectric layer by etching the hard mask layer and the interlayer dielectric layer using the first photoresist pattern as an etching mask;

removing the first photoresist pattern;

depositing a second photoresist layer to fill the partial via hole with photoresist material and patterning the second photoresist layer to form a second photoresist pattern that defines a trench interconnection area which overlaps at least portion of the partial via hole;

etching the hard mask layer using the second photoresist pattern as an etching mask to form a hard mask pattern;

completely removing the second photoresist pattern and the photoresist material in the partial via hole;

etching the interlayer dielectric layer using the hard mask pattern as an etching mask to form the trench interconnection area and to extend the partial via hole to form a full via hole; and filling the full via hole and the trench interconnection area with a conductive material.

2. The method of claim 1, wherein forming the interlayer dielectric layer on the substrate comprises forming a first stopper layer on the substrate and forming the interlayer dielectric layer on the first stopper layer, and wherein the method further comprises removing a portion of the first stopper layer that is exposed through the full via hole before filling the full via hole and the trench interconnection area with the conductive material.

3. The method of claim 2, wherein forming the interlayer dielectric layer on the substrate comprises forming a first interlayer dielectric layer on the first stopper layer and forming a second interlayer dielectric layer on the first interlayer dielectric layer.

4. The method of claim 3, further comprising forming a second stopper layer on the first interlayer dielectric layer before forming the second interlayer dielectric layer.

5. The method of claim 1, wherein the hard mask layer is formed of SiCN, SiON, SiCON, TaN, TiN, TiON, TaON, AlN, or AlON, or any combination thereof.

6. The method of claim 1, wherein the hard mask layer has a thickness of about 1000 Å.

7. The method of claim 1, wherein forming the hard mask layer comprises forming a first hard mask layer on the interlayer dielectric layer and forming a second hard mask layer on the first hard mask layer.

8. The method of claim 7, wherein the first and second hard mask layers are anti-reflection layers.

9. The method of claim 8, wherein the hard mask layer has a thickness of about 1000 Å.

10. The method of claim 7, wherein the second hard mask layer is an anti-reflection layer and wherein the first hard mask layer is a non anti-reflection layer having an etching selectivity to the interlayer dielectric layer.

11. The method of claim 10, wherein the first hard mask layer is formed of AlO, TaO, or TiO.

12. The method of claim 10, wherein the second hard mask layer has a thickness of about 600 Å, and wherein the first hard mask layer has a thickness in a range of about 100 Å to about 200 Å.

13. The method of claim 1, further comprising etching the photoresist material in the partial via hole to a depth below a bottom surface of the hard mask layer while etching the hard mask layer using the second photoresist pattern as an etching mask.

14. The method of claim 1, wherein etching the hard mask layer using the second photoresist pattern as an etching mask is performed using a fluorine-based gas such as $CF_4$, $CH_2F_2$, $CHF_3$, $CH_3F$, $NF_3$, or $SF_6$.

15. The method of claim 1, wherein etching the hard mask layer using the second photoresist pattern as an etching mask is performed using a chloride-based gas such as $Cl_2$ or $BCl_3$.

16. The method of claim 1, further comprising etching the photoresist material in the partial via hole to a depth below a bottom surface of the hard mask layer before etching the hard mask layer using the second photoresist pattern as an etching mask.

17. The method of claim 1, wherein etching the interlayer dielectric layer using the hard mask pattern as an etching mask is performed using an etching gas comprising (i) an oxygen-based gas such as $O_2$, CO, or $CO_2$, (ii) a nitrogen-based gas such as $N_2$ or $N_2O$, or (iii) an inert gas such as Ar, He or Xe.

18. The method of claim 1, wherein etching the interlayer dielectric layer using the hard mask pattern as an etching mask is performed using a CF-based etching gas.

19. The method of claim 1, wherein etching the interlayer dielectric layer using the hard mask pattern as an etching mask is performed using an etching gas comprising (i) a $CH_xF_y$-based gas such as $CH_2F_2$ or $CH_3F$, (ii) an oxygen-based gas such as $O_2$, CO or $CO_2$, (iii) a nitrogen-based gas such as $N_2$ or $N_2O$ or (iv) an inert gas such as He, Ar, or Xe.

20. A method of forming a metal interconnection layer of a semiconductor device, comprising:
- forming an interlayer dielectric layer on a substrate;
- forming a hard mask layer on the interlayer dielectric layer, wherein the hard mask layer serves as an anti-reflection layer;
- depositing and patterning a first photoresist layer to form a first photoresist pattern on the hard mask layer;
- forming a partial via hole in the interlayer dielectric layer by etching the hard mask layer and the interlayer dielectric layer using the first photoresist pattern as an etching mask;
- removing the first photo resist pattern;
- depositing a layer of sacrificial material to completely or partially bury the partial via hole;
- depositing and patterning a second photoresist layer to form a second photoresist pattern that defines a trench interconnection area which overlaps at least a portion of the partial via hole;
- etching the hard mask layer using the second photoresist pattern as an etching mask to form a hard mask pattern;
- completely removing the second photoresist pattern and the layer of sacrificial material;
- etching the interlayer dielectric layer using the hard mask pattern as an etching mask to form the trench interconnection area and to extend the partial via hole to form a full via hole; and
- filling the full via hole and the trench interconnection area with a conductive material.

21. The method of claim 20, wherein forming the interlayer dielectric layer on the substrate comprises forming a first stopper layer on the substrate and forming the interlayer dielectric layer on the first stopper layer, and wherein the method further comprises removing a portion of the first stopper layer that is exposed through the full via hole before filling the full via hole and the trench interconnection area with the conductive material.

22. The method of claim 21, wherein forming the interlayer dielectric layer on the substrate comprises forming a first interlayer dielectric layer on the first stopper layer and forming a second interlayer dielectric layer on the first interlayer dielectric layer.

23. The method of claim 22, further comprising forming a second stopper layer on the first interlayer dielectric layer before forming the second interlayer dielectric layer.

24. The method of claim 20, wherein the hard mask layer is formed of SiCN, SiON, SiCON, TaN, TiN, TiON, TaON, AlN, or AlON, or any combination thereof.

25. The method of claim 20, wherein the hard mask layer has a thickness of about 1000 Å.

26. The method of claim 20, wherein forming the hard mask layer comprises forming a first hard mask layer on the interlayer dielectric layer and forming a second hard mask layer on the first hard mask layer.

27. The method of claim 26, wherein the first and second hard mask layers are anti-reflection layers.

28. The method of claim 27, wherein the hard mask layer has a thickness of about 1000 Å.

29. The method of claim 26, wherein the second hard mask layer is an anti-reflection layer and wherein the first hard mask layer is a non anti-reflection layer having an etching selectivity to the interlayer dielectric layer.

30. The method of claim 29, wherein the first hard mask layer is formed of AlO, TaO, or TiO.

31. The method of claim 29, wherein the second hard mask layer has a thickness of about 600 Å, and wherein the first hard mask layer has a thickness in a range of about 100 Å to about 200 Å.

32. The method of claim 20, wherein etching the interlayer dielectric layer using the hard mask pattern as an etching mask is performed using a CF-based gas.

33. The method of claim 20, wherein etching the interlayer dielectric layer using the hard mask pattern as an etching mask is performed using an etching gas comprising (i) a $CH_xF_y$-based gas such as $CH_2F_2$ and $CH_3F$, (ii) an oxygen-based gas such as $O_2$, CO, or $CO_2$, (iii) a nitrogen-based gas such as $N_2$ or $N_2O$, or (iv) an inert gas such as He, Ar or Xe.

34. The method of claim 20, wherein depositing a layer of sacrificial material to completely bury the partial via hole includes forming a uniformly thick layer of sacrificial material over the hard mask layer.

35. The method of claim 20, further comprising etching the sacrificial material in the partial via hole to a depth below a bottom surface of the hard mask layer while etching the hard mask layer using the second photoresist pattern as an etching mask.

36. The method of claim 20, wherein etching the hard mask layer using the second photoresist pattern as an etching mask is performed using a fluorine-based gas such as $CF_4$, $CH_2F_2$, $CHF_3$, $CH_3F$, $NF_3$ or $SF_6$.

37. The method of claim 20, wherein etching the hard mask layer using the second photoresist pattern as an etching mask is performed using a chloride-based gas such as $Cl_2$ or $BCl_3$.

38. The method of claim 20, further comprising etching the sacrificial material in the partial via hole to a depth below a bottom surface of the hard mask layer before etching the hard mask layer using the second photoresist pattern as an etching mask.

* * * * *